(12) United States Patent
Millington et al.

(10) Patent No.: US 8,020,023 B2
(45) Date of Patent: Sep. 13, 2011

(54) SYSTEMS AND METHODS FOR SYNCHRONIZING OPERATIONS AMONG A PLURALITY OF INDEPENDENTLY CLOCKED DIGITAL DATA PROCESSING DEVICES WITHOUT A VOLTAGE CONTROLLED CRYSTAL OSCILLATOR

(75) Inventors: Nicholas A. J. Millington, Santa Barbara, CA (US); Michael Ericson, Santa Barbara, CA (US)

(73) Assignee: Sonos, Inc., Santa Barbara, CA (US)

( * ) Notice: Subject to any disclaimer, the term of this patent is extended or adjusted under 35 U.S.C. 154(b) by 1078 days.

(21) Appl. No.: 11/801,468

(22) Filed: May 9, 2007

(65) Prior Publication Data

US 2007/0214229 A1 Sep. 13, 2007

Related U.S. Application Data

(63) Continuation-in-part of application No. 10/816,217, filed on Apr. 1, 2004, application No. 11/801,468.

(60) Provisional application No. 60/490,768, filed on Jul. 28, 2003, provisional application No. 60/860,964, filed on Nov. 22, 2006, provisional application No. 60/876,455, filed on Dec. 20, 2006.

(51) Int. Cl.
*G06F 1/00* (2006.01)
*G06F 11/00* (2006.01)
*G06F 15/16* (2006.01)

(52) U.S. Cl. ........ 713/500; 713/503; 713/600; 709/208; 375/295; 375/316

(58) Field of Classification Search .................. 713/500, 713/503, 600; 709/208; 375/295, 316
See application file for complete search history.

(56) References Cited

U.S. PATENT DOCUMENTS

| | | | |
|---|---|---|---|
| 5,956,088 A * | 9/1999 | Shen et al. ............... | 375/240.25 |
| 6,009,457 A | 12/1999 | Moller | |
| 6,128,318 A | 10/2000 | Sato | |
| 6,199,169 B1 | 3/2001 | Voth | |
| 6,324,586 B1 | 11/2001 | Johnson | |
| 6,351,821 B1 | 2/2002 | Voth | |
| 6,598,172 B1 * | 7/2003 | VanDeusen et al. .......... | 713/503 |
| 6,836,788 B2 | 12/2004 | Kim et al. | |
| 6,934,766 B1 | 8/2005 | Russell | |
| 7,312,785 B2 | 12/2007 | Tsuk | |
| 7,372,846 B2 | 5/2008 | Zwack | |
| 7,676,142 B1 * | 3/2010 | Hung ............................ | 386/131 |
| 2001/0032188 A1 | 10/2001 | Miyabe | |
| 2002/0090914 A1 | 7/2002 | Kang et al. | |

(Continued)

OTHER PUBLICATIONS

Benslimane, Abderrahim, "A Multimedia Synchronization Protocol for Multicast Groups," 2000, IEEE, Proceedings of the 26th Euromicro Conference, 2000, vol. 1, pp. 456-463.

(Continued)

*Primary Examiner* — Vincent T Tran
(74) *Attorney, Agent, or Firm* — Hanley, Flight & Zimmerman, LLC; Mark Triplett

(57) ABSTRACT

Exemplary systems and methods include a distribution device that maintains a clock rate and distributes a series of tasks to a group of execution devices. Each task has a plurality of samples per frame associated with a time stamp indicating when the task is to be executed. The execution devices execute the series of tasks at the times indicated and adjust the number of samples per frame in relation to the clock rate maintained by the distribution device.

19 Claims, 4 Drawing Sheets

U.S. PATENT DOCUMENTS

| | | | |
|---|---|---|---|
| 2002/0112244 A1 | 8/2002 | Liou et al. | |
| 2003/0002609 A1* | 1/2003 | Faller et al. | 375/372 |
| 2003/0043924 A1* | 3/2003 | Haddad et al. | 375/240.28 |
| 2003/0099212 A1 | 5/2003 | Anjum | |
| 2003/0126211 A1 | 7/2003 | Anttila et al. | |
| 2004/0075767 A1* | 4/2004 | Neuman et al. | 348/506 |
| 2004/0203378 A1 | 10/2004 | Powers | |
| 2005/0283820 A1* | 12/2005 | Richards et al. | 725/146 |
| 2006/0119497 A1* | 6/2006 | Miller et al. | 341/144 |
| 2007/0054680 A1* | 3/2007 | Mo et al. | 455/502 |
| 2007/0143493 A1* | 6/2007 | Mullig et al. | 709/232 |
| 2007/0180137 A1* | 8/2007 | Rajapakse | 709/231 |
| 2008/0022320 A1* | 1/2008 | Ver Steeg | 725/78 |

OTHER PUBLICATIONS

Mills, David, "Precision Synchronization of Computer Networks Clocks," 1994, ACM Computer Communications Review, vol. 24, pp. 28-43.

Bretl et al, "MPEG2 Tutorial," 2000, www.bretl.com, retrieved http://www.bretl.com/mpeghtml/MPEGindex.htm on Jan. 2009, pp. 1-23.

International Search Report for Patent Cooperation Treaty application No. PCT/US04/23102 dated Aug. 1, 2008.

Jo et al., "Synchronized One-to-Many Media Streaming with Adaptive Playout Control," In: Proceedings of SPIE, vol. 4861, Edited by Tescher et al., Dec. 2002, pp. 71-82.

Mills, David L., "Network Time Protocol Specification, Implementation and Analysis," Request for Comments: 1305, Network Working Group, Mar. 1992 (Mar. 2003).

Huang et al. A Synchronization Infrastructure for Multicast Multimedia at the Presentation Layer. IEEE Transactions on Consumer Electronics, vol. 43, No. 3, Aug. 1997.

Ishibashi et al. A Group Synchronization Mechanism for Stored Media in Multicast Communications. IEEE, 1997.

Ishibashi et al. A Group Synchronization Mechanism for Live Media in Multicast Communications. IEEE, 1997.

* cited by examiner

SYSTEMS AND METHODS FOR SYNCHRONIZING OPERATIONS AMONG A PLURALITY OF INDEPENDENTLY CLOCKED DIGITAL DATA PROCESSING DEVICES WITHOUT A VOLTAGE CONTROLLED CRYSTAL OSCILLATOR

CROSS-REFERENCE TO RELATED APPLICATIONS

The present continuation-in-part application claims the benefit and priority of U.S. patent application Ser. No. 10/816,217 filed on Apr. 1, 2004 for "System and Method For Synchronizing Operations Among a Plurality of Independently Clocked Digital Data Processing Devices," which is incorporated herein by reference, which claims the benefit and priority of U.S. Provisional Patent Application Ser. No. 60/490,768 filed on Jul. 28, 2003 for "Method For Synchronizing Audio Playback Between Multiple Networked Devices," which is incorporated herein by reference; and the present application incorporates by reference U.S. Provisional Patent Application Ser. No. 60/860,964 filed on Nov. 22, 2006 and U.S. Provisional Patent Application Ser. No. 60/876,455 filed on Dec. 20, 2006, both for "Systems and Methods for Synchronizing Operations Among a Plurality of Independently Clocked Digital Data Processing Devices that Independently Source Digital Data."

FILED OF THE INVENTION

The present invention relates generally to digital content, and more particularly, to systems and methods for synchronizing operations, among a plurality of independently clocked digital data processing devices without a voltage controlled crystal oscillator.

DESCRIPTION OF RELATED ART

Conventionally, playing the same digital content over multiple audio and/or audiovisual reproduction devices simultaneously or in synchrony is limited by the inherent differences in the frequencies or clock rates of the crystal oscillators influencing the rates in which the digital content is converted to analog content for playing over the respective audio and/or audiovisual reproduction devices. Previous approaches that solve this problem require expensive hardware and/or circuitry, which also requires additional space within the audio and/or audiovisual reproduction device. There is thus a need for systems and methods for synchronizing operations among a plurality of independently clocked digital data processing devices without a voltage controlled crystal oscillator.

SUMMARY OF THE INVENTION

Exemplary systems and methods are provided that include a distribution device that maintains a clock rate and distributes a series of tasks to a group of execution devices (or synchrony group). Each task has a plurality of samples per frame associated with a time stamp indicating when the task is to be executed. An execution device executes the series of tasks at the times indicated and adjusts the number of samples per frame in relation to the clock rate maintained by the distribution device. The synchrony group may also be configured to adjust samples per frame in relation to a clock rate maintained by the distribution device.

DETAILED DESCRIPTION

Figure 1:
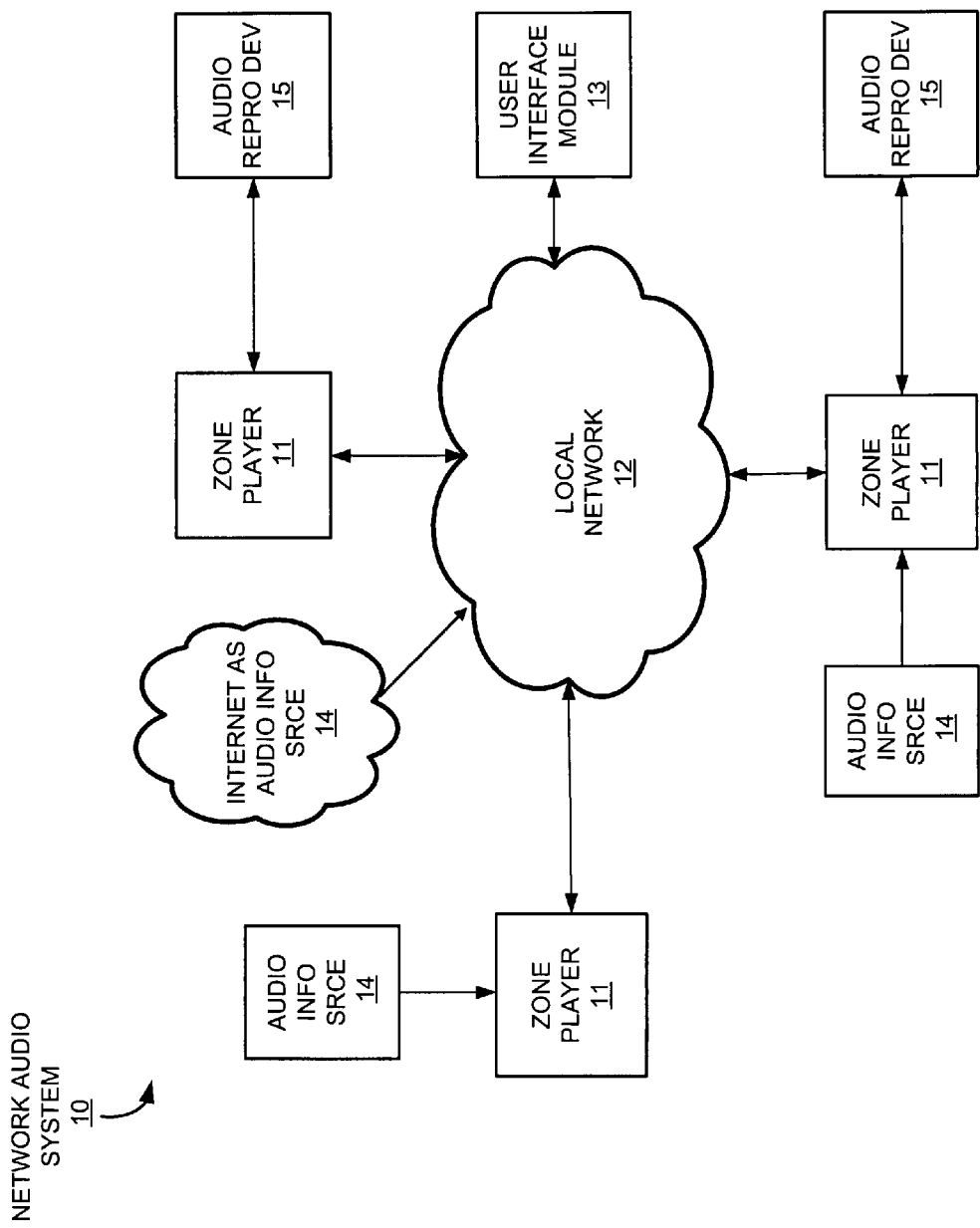
FIG. 1 illustrates an exemplary networked system.

Referring to FIG. 1, an exemplary network audio system 10 is shown in which various embodiments of the invention may be practiced. Although the term "audio" is used in connection with the exemplary network audio system 10, it will readily be appreciated that the herein described systems and methods may be employed with other forms of digital data, including visual and/or audiovisual digital data.

The exemplary network audio system 10 includes at least one zone player 11, interconnected by a local network 12, all of which may operate under the control of one or more user interface modules identified by reference numeral 13. The zone player 11 is sometimes referred to as a digital data processing device. One or more of the zone players 11 may also be connected to one or more audio information sources, which will generally be identified herein by reference numeral 14, and/or connected to one or more audio reproduction devices, which will generally be identified by reference numeral 15. It will be appreciated that the number of audio information sources may vary as among the various zone players 11, and some zone players may not have any audio information sources connected thereto.

A plurality of zone players 11 associated with a network audio system 10 may be distributed throughout an establishment, such as residence, an office complex, a hotel, a conference hall, an amphitheater, auditorium, or other types of establishments as will be apparent to those skilled in the art. For example, a zone player 11 and its associated audio information source(s) and audio reproduction device(s) may be located in a living room, another zone player may be located in a kitchen, another zone player may be located in a dining room, and other zone players may be located in bedrooms, to selectively provide entertainment in those rooms. The audio information sources 14 may be any of a number of types of conventional sources of audio information, including, for example, compact disc ("CD") players, AM and/or FM radio receivers, analog or digital tape cassette players, analog record turntables and the like. In addition, the audio information sources 14 may comprise digital audio files stored locally on, for example, personal computers (PCs), personal digital assistants (PDAs), or similar devices capable of storing digital information in volatile or non-volatile form. The audio information sources 14 may also comprise an interface to a wide area network such as the Internet, or any other source of audio information, or an interface to radio services delivered over, for example, satellite. Audio information obtained over the wide area network may comprise, for example, streaming digital audio information such as Internet radio, digital audio files stored on servers, and other types of audio information and sources as will be appreciated by those skilled in the art.

Generally, the audio information sources 14 provide audio information associated with audio programs to the zone players for playback. A zone player that receives audio information from an audio information source 14 that is connected thereto may provide playback and/or forward the audio information, along with playback timing information, over the local network 12 to other zone players for playback. Users, using user interface module 13, may also enable different groupings or sets of zone players to provide audio playback of different audio programs synchronously.

Figure 2:
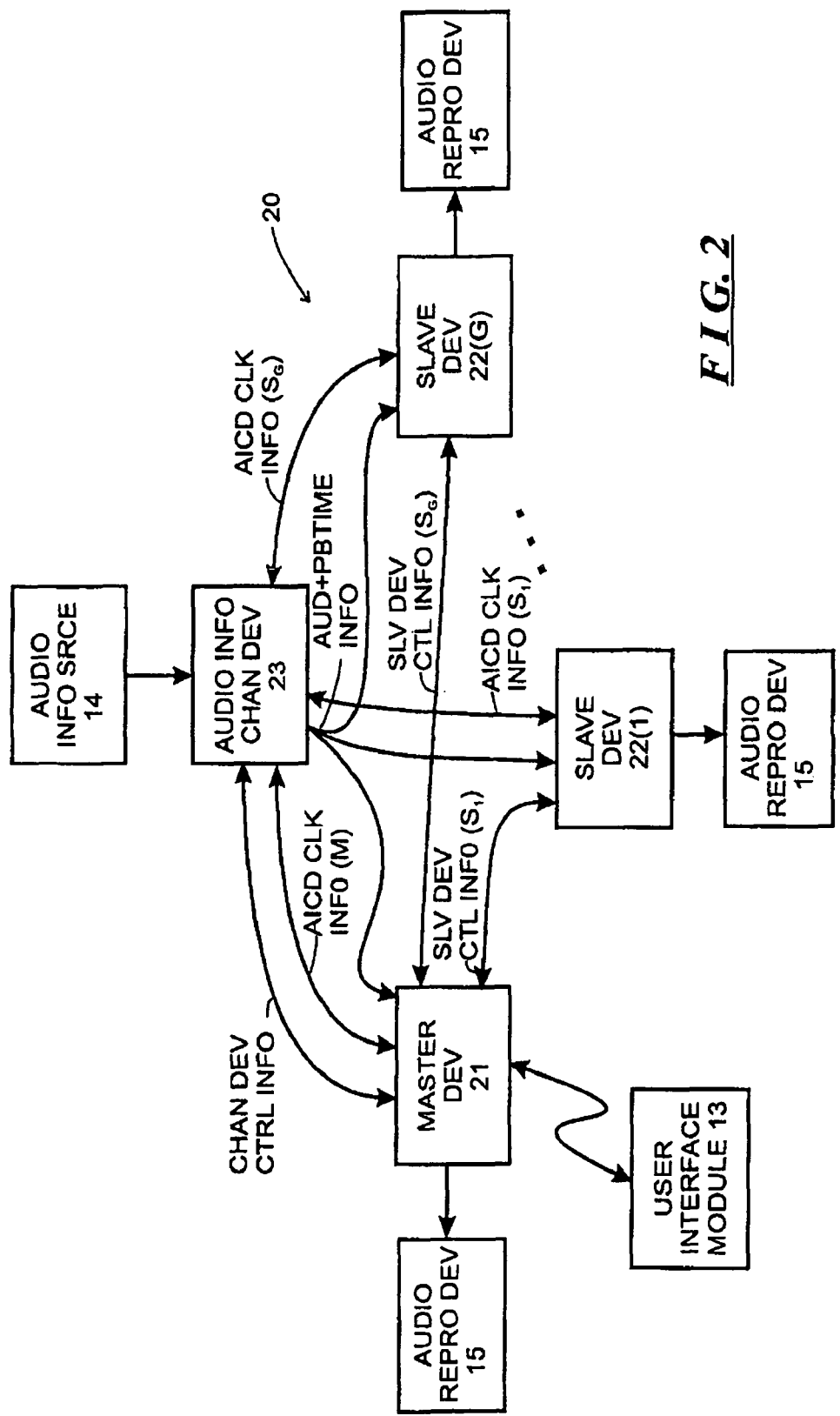
FIG. 2 illustrates a functional block diagram of a synchrony group utilizing a plurality of zone players formed within the exemplary networked system depicted in FIG. 1.

Referring to FIG. 2, an exemplary group of execution devices (or "synchrony group") 20 according to one embodiment of the invention is shown. The exemplary synchrony group 20 comprises synchrony group member devices or member devices including a master execution device 21 and zero or more slave devices 22(1) through 22(G) (generally identified by reference numeral 22(g)), all of which synchronously play an audio program provided by an audio information channel device 23. The audio information channel device 23 is sometimes referred to as a task source or a task distribution device. Each master execution device 21, slave device 22(g), and/or audio information channel device 23 may utilize a zone player 11 as depicted in FIG. 1. The zone player 11 may function as an audio information channel device 23, a master execution device 21, or a slave device 22(g) for the synchrony group 20. The audio information channel device 23 may obtain audio information for the audio program from an audio information source 14, add playback timing information, and transmit the combined audio and playback timing information to the master execution device 21 and slave devices 22(g) over local network 12 (FIG. 1) for playback. The playback timing information that is provided with the audio information, together with clock timing information provided by the audio information channel device 23 to the various devices 21 and 22(g), enables the master execution device 21 and slave devices 22(g) of the synchrony group 20 to play the audio information simultaneously.

The master execution device 21 and the slave devices 22(g) receive the audio and playback timing information, as well as the clock timing information, that are provided by the audio information channel device 23, and play back the audio program defined by the audio information. The master execution device 21 also communicates with the user interface module 13, controls the operations of the slave devices 22(g) in the synchrony group 20, and controls the operations of the audio information channel device 23 that provides the audio and playback timing information for the synchrony group 20. Generally, the initial master execution device 21 for the synchrony group will be the first zone player 11 that a user wishes to play an audio program. However, the master execution device 21 may be migrated from a first zone player to a second zone player, which preferably will be a zone player that is currently operating as a slave device 22(g) in the synchrony group.

In addition, under certain circumstances, the audio information channel device 23 may be migrated from one zone player to another zone player, which also may be a zone player that is currently operating as a member of the synchrony group 20. It will be appreciated that the zone player that operates as the master execution device 21 may be migrated to another zone player independently of the migration of the audio information channel device 23. For example, if a first zone player is operating as both the master execution device 21 and the audio information channel device 23 for a synchrony group 20, the function of the master execution device 21 may be migrated to a second zone player while the first zone player is still operating as the audio information channel device 23. Similarly, if a first zone player is operating as both the master execution device 21 and the audio information channel device 23 for a synchrony group 20, the source function of the audio information channel device 23 may be migrated to a second zone player while the first zone player is still operating as the master execution device 21. In addition, if a first zone player is operating as both the master execution device 21 and the audio information channel device 23 for a synchrony group 20, the master execution device 21 may be migrated to a second zone player and the audio information channel device may be migrated to a third zone player.

The master execution device 21 receives control information from the user interface module 13 for controlling the synchrony group 20 and provides status information indicating the operational status of the synchrony group 20 to the user interface module 13. Generally, the control information from the user interface module 13 causes the master execution device 21 to enable the audio information channel device 23 to provide audio and playback timing information to the synchrony group, allowing the devices 21 and 22(g) that are members of the synchrony group 20 to play the audio program synchronously. In addition, the control information from the user interface module 13 causes the master execution device 21 to enable other zone players to join the synchrony group as slave devices 22(g) and/or to cause slave devices 22(g) to disengage from the synchrony group. Control information from the user interface module 13 may also cause the zone player 11 that is currently operating as the master execution device 21 to disengage from the synchrony group, but prior to doing so, that zone player will cause the function of the master execution device 21 to transfer from that zone player 11 to a second zone player, preferably to a second zone player that is currently a slave device 22(g) in the synchrony group 20. The control information from the user interface module 13 may also cause the master execution device 21 to adjust its playback volume and/or to enable individual ones of the various slave devices 22(g) to adjust their playback volumes. In addition, the control information from the user interface module 13 may cause the synchrony group 20 to terminate playing of a current track of the audio program and skip to the next track, and to re-order tracks in a play list of tracks defining the audio program that are to be played by the synchrony group 20. The status information that the master execution device 21 may provide to the user interface module 13 may include such information as a name or other identifier for the track of an audio work that is currently being played, the names or other identifiers for upcoming tracks, the identifier of the zone player 11 that is currently operating as the master execution device 21, and identifiers of the zone players that are currently operating as slave devices 22(g). In one embodiment, the user interface module 13 may include a display that can display the status information to the user. It will be appreciated that the zone player 11 that is operating as the audio information channel device 23 for one synchrony group may also comprise the master execution device 21 or any of the slave devices 22(g) in another synchrony group. This may occur if, for example, the audio information source that is to provide the audio information that is to be played by the one synchrony group is connected to a zone player also being utilized as the master execution device or a slave device for the other synchrony group.

Figure 3:
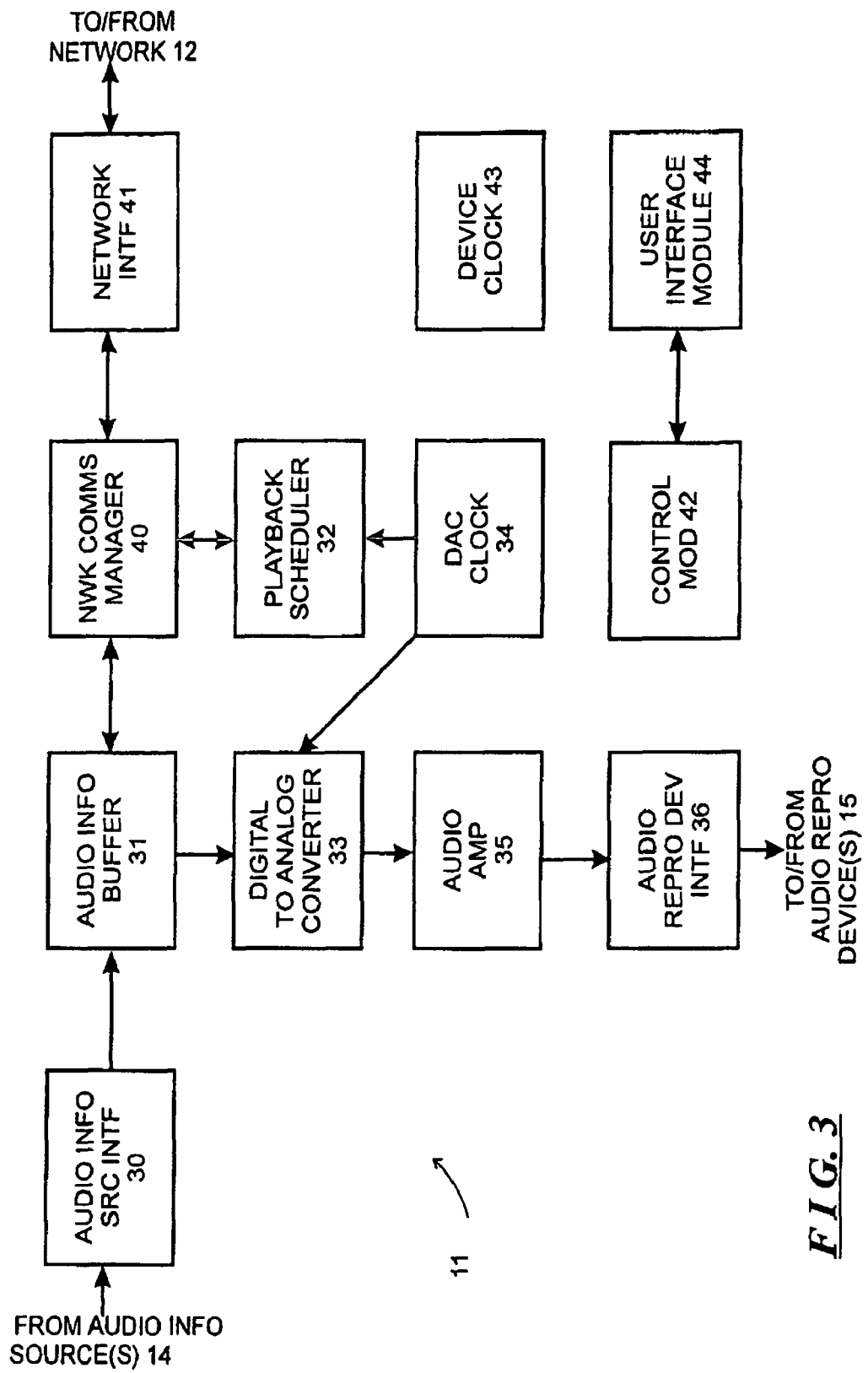
FIG. 3 illustrates a functional block diagram of a zone player for use in the networked system depicted in FIG. 1.

Referring to FIG. 3, a functional block diagram of an exemplary zone player 11 constructed in accordance with one embodiment of the invention is shown. The exemplary zone player 11 includes an audio information source interface 30, an audio information buffer 31, a playback scheduler 32, a digital to analog converter 33, an audio amplifier 35, an audio reproduction device interface 36, a network communications manager 40, a network interface 41, and a control module 42. In an alternative system and method, the exemplary zone player 11 may not include the audio amplifier 35. In a further embodiment, the zone player 11 includes and/or forms part of the audio reproduction device 15. The zone player 11 also has a device clock 43 that provides timing signals that control the general operations of the zone player 11. In addition, the zone player 11 includes a user interface module interface 44 that can receive control signals from the user interface module 13 (FIGS. 1 and 2) for controlling operations of the zone player 11, and provides status information to the user interface module 13.

Generally, the audio information buffer 31 buffers audio information, in digital form, along with playback timing information. If the zone player 11 is operating as the audio information channel device 23 (FIG. 2) for a synchrony group 20, the information that is buffered in the audio information buffer 31 may include the audio and playback timing information that will be provided to the devices 21 and 22(g) in the synchrony group 20. If the zone player 11 is operating as the master execution device 21 or a slave device 22(g) for a synchrony group (20), the information that is buffered in the audio information buffer 31 may include the audio and playback timing information that the zone player 11 is to play. The audio information buffer 31 may receive audio and playback timing information from two sources, namely, the audio information source interface 30 and the network communications manager 40. In particular, if the zone player 11 is operating as the audio information channel device 23 for a synchrony group 20, and if the audio information source is a source 14 connected to the zone player 11, the audio information buffer 31 may receive and buffer audio and playback timing information from the audio information source interface 30. Alternatively, if the zone player 11 is operating as the audio information channel device 23 for a synchrony group 20, and if the audio information source is a source 14 connected to the network 12, or a source available over a wide area network, the audio information buffer 31 may receive, and buffer audio and playback timing information from the network communications manager 40. However, if the zone player 11 is operating as the master execution device 21 or a slave device 22(g) in a synchrony group 20, and if the zone player 11 is not also the audio information channel device 23 providing audio and playback timing information for the synchrony group 20, the audio information buffer 31 may receive and buffer audio and playback timing information from the network communications manager 40. It will be appreciated that, if the zone player 11 is not a member of the synchrony group, the zone player 11 may not play this buffered audio and playback timing information.

According to some embodiments, the audio information source interface 30 connects to the audio information source(s) 14 associated with the zone player 11. While the zone player 11 is operating as the audio information channel device 23 for a synchrony group 20, and if the audio information is to be provided by a source 14 connected to the zone player 11, the audio information source interface 30 will selectively receive audio information from one of the audio information source(s) 14 to which the zone player is connected and store the audio information in the audio information buffer 21. If the audio information from the selected audio information source 14 is in analog form, the audio information source interface 30 will convert it to digital form. The selection of the audio information source 14 from which the audio information source interface 30 receives audio information is under the control of the control module 42, which, in turn, receives control information from the user interface module through the user interface module interface 44. The audio information source interface 30 adds playback timing information to the digital audio information and buffers the combined audio and playback timing information in the audio information buffer 21. More specifically, the audio information source interface 30 receives audio information from an audio information source 14, converts it to digital form if necessary, and buffers it along with playback timing information in the audio information buffer 21. In addition, the audio information source interface 30 may also provide formatting and scheduling information for the digital audio information, whether as received from the selected audio information source 14 or as converted from an analog audio information source. The formatting and scheduling information will control not only playback by the zone player 11 itself, but will also enable other zone players that may be in a synchrony group for which the zone player 11 is the master execution device to play the audio program associated with the audio information in synchrony with the zone player 11.

In one particular embodiment, the audio information source interface 30 divides the audio information associated with an audio work into a series of frames, with each frame comprising digital audio information for a predetermined period of time. As used herein, an audio track may comprise any unit of audio information that is to be played without interruption, or a series of one or more audio tracks that are to be played in succession. It will be appreciated that the tracks comprising the audio program may also be played without interruption, or alternatively playback between tracks may be interrupted by a selected time interval.

Figure 4:
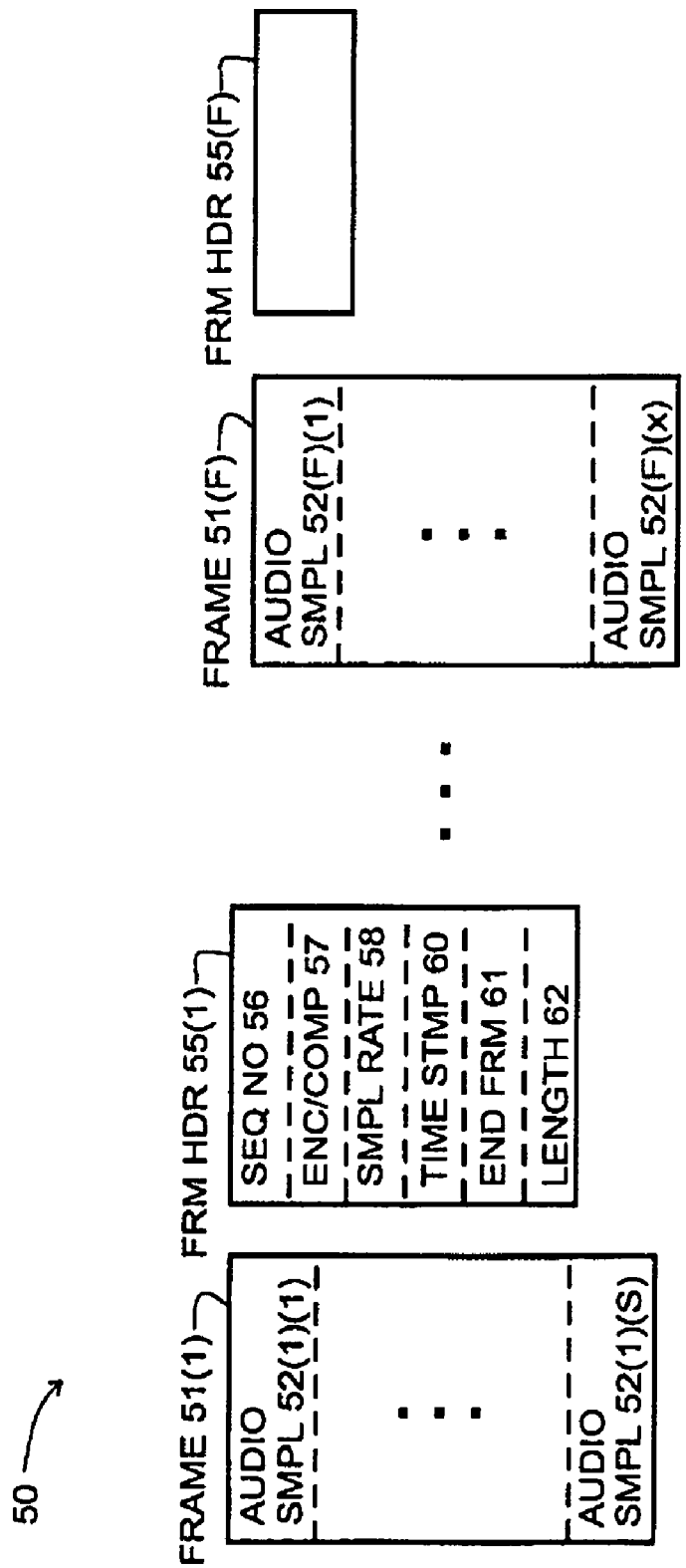
FIG. 4 illustrates an exemplary digital framing methodology.

FIG. 4 depicts an illustrative framing strategy used in connection with one system and method of the invention for a digital audio stream comprising an audio work. A framed digital audio stream 50 comprises a sequence of frames 51(1) through 51(F) (generally identified by reference numeral 51(f). Here, "(f)" may represent a generic sequence number for any particular frame (51), with the actual sequence numbers ranging from "(1)" to "(F)." Each frame 51(f), in turn, comprises a series of audio samples 52(f)(1) through 52(f)(S) (generally identified by reference numeral 52(f)(s)) of the audio track. The number of audio samples 52(f)(s) may differ in each frame 51(f). Associated with each frame 51(f) is a header 55(f) that includes a number of fields for storing other information that is useful in controlling playback of the audio samples in the respective frame 51(f). In particular, the header 55(f) associated with a frame 51(f) includes a frame sequence number field 56, an encoding type field 57, a sampling rate information field 58, a time stamp field 60, an end of track flag 61, and a length flag field 62. The header 55(f) may also include fields for storing other information that is useful in controlling playback.

Generally, the frame sequence number field 56 receives a number which will generically be the number "f," from the range 1 through F as above, that identifies the relative position of the frame 51(f) in the sequence of frames containing the digital audio stream 50. The encoding type field 57 receives a value that identifies the type of encoding and/or compression that has been used in generating the digital audio stream. Conventional encoding or compression schemes include, for example, MP3 and WAV encoding and/or compression schemes, although it will be appreciated that other schemes may be provided for as well. The sampling rate information field 58 includes sampling rate information that may, indicate the sampling rate relative to the audio information channel device 23 and/or the sampling rate relative to a current inherent, clock rate of a synchrony group member. The condition of the end of work flag 61 indicates whether the frame 51(f) contains the last digital audio samples for the audio track associated with the framed digital audio work 50. If the frame 51(f) does not contain the audio samples that are associated with the end of the digital audio stream 50 for a respective audio work, the end of work flag will be clear. On the other hand, if the frame 51(*f*) does contain the audio samples that are associated with the end of the digital audio stream 50 for a respective audio work, the end of work flag 61 will be set. In addition, the length flag field 62 will contain a value that identifies the number of audio samples in the last frame 51(F) of the audio work 50. The time stamp field 60 stores a time stamp that identifies the time at which the zone player 11 is to play the respective frame.

Within each synchrony group member, for each frame of a framed digital audio stream 50 that is buffered in the audio information buffer 21, the audio information source interface 30, using timing information from the digital to analog converter clock 34, may determine a time at which the zone player 11 is to play the respective frame, and will store a time stamp identifying the playback time in the time stamp field 60. The time stamp associated with each frame is used by the playback scheduler 32 to determine when the portion of the digital audio stream stored in the frame is to be coupled to the digital to analog converter 33 to initiate play back. It will be appreciated that the time stamps that are associated with each of the frames in sequential frames will be such that they will be played back in order, and without an interruption between the sequential frames comprising the digital audio stream 50. It will further be appreciated that, after a time stamp has been determined for the first frame and stored in frame 51(1) of a digital audio stream 50, the audio information source interface 30 may determine time stamps for the subsequent frames in relation to the number of samples in the respective frames and the current inherent clock rate of the synchrony group member. The time stamps will also preferably be such that frames will be played back after some slight time delay after they have been buffered in the audio information buffer 21.

In some embodiments, the zone players 11 are provided with a digital to analog converter clock 34 whose time may be set by an element such as the network communications manager 40. When a zone player 11 is operating as a member of a synchrony group 20, its network communications manager 40 may use the various types of timing information that it receives from the audio information channel device 23 to adjust the time value of the synchrony group member's digital to analog converter clock 34. If the clock's time value is to be adjusted, when the synchrony group member's network communications manager 40 initially receives the current time information from the audio information channel device 23 for the synchrony group 20, the network communications manager 40 may set the synchrony group member's digital to analog converter clock 34 to the current time value as indicated by the audio information channel device's current time information 23. The network communications manager 40 may set the digital to analog converter clock 34 to the current time value indicated by the audio information channel device's current time information once, or periodically as it receives the current time information.

After the network communications manager 40 receives a frame 51(*f*) from the network interface 41, it may also obtain, from the digital to analog converter clock 34, the zone player 11's current time as indicated by its digital to analog converter clock 34. The network communications manager 40 may determine a time differential value that is the difference between the slave device's current clock time, as indicated by its digital to analog converter clock 34, and the audio information channel device's time as indicated by the audio information channel device's clock timing information. Accordingly, if the slave device's current time has a value TS and the audio information channel device's current time, as indicated by the clock timing information, has a value TC, the time differential value $\Delta T = TS - TC$. If the current time of the slave device in the synchrony group 20, as indicated by its digital to analog converter clock 34, is ahead of the audio information channel device's clock time, the time differential value will have a positive value. On the other hand, if the slave device's current time is behind the audio information channel device's clock time, the time differential value $\Delta T$ will have a negative value. If the zone player 11 obtains clock timing information from the audio information channel device 23 periodically while it is a member of the synchrony group 20, the network communications manager 40 may generate an updated value for the time differential value $\Delta T$ when it receives the clock timing information from the audio information channel device 23, and may subsequently use the updated time differential value.

The network communications manager 40 may use the time differential value $\Delta T$ that it generates from the audio information channel device timing information and zone player 11's current time to update the time stamps that will be associated with the digital audio information frames that the zone player 11 receives from the audio information channel device. For each digital audio information frame that is received from the audio information channel device, instead of storing the time stamp that is associated with the frame as received in the message in the audio information buffer 21, the network communications manager 40 will store the updated time stamp with the digital audio information frame. The updated time stamp is generated in a manner so that, when the zone player 11, as a member of the synchrony group plays back the digital audio information frame, it will do so in synchrony with other devices in the synchrony group.

The network communications manager 40 may utilize the updated time stamps associated with respective frames 51(*f*) to accommodate the current inherent clock rate of the digital to analog converter clock 34 of the synchrony group member. For example, when the synchrony group member's network communications manager 40 receives a first frame 51(1) having a time stamp having a time value T, it can generate an updated time value TU, and store the frame 51(1) with the updated time value TU in the audio information buffer 31 (e.g., 51(1)TU). In addition, since both the number of samples in a frame and the current inherent clock rate of the digital to analog converter clock 34, which determines the rate at which the samples in a frame are to be played by the synchrony group member, are known to the network communications manager 40, the network communications manager 40 can use that information, along with the time value TU to generate an expected or predicted time value TE for the time stamp of the next frame 51(2). After the synchrony group member's network communications manager 40 receives frame 51(2), it can generate the updated time value TU for frame 51(2) and compare that time value to the time value TE that was predicted for frame 51(2). If the two time values do not correspond, or if the difference between them is above a selected threshold level, the clock that is used by the audio information channel device 23 to generate the time stamps is advancing at a different rate than the synchrony group member's digital to analog converter clock 34, and the network communications manager 40 may adjust the number of samples per frame to accommodate the current inherent clock rate of the digital to analog converter clock 34 of the synchrony group member. If the two time values do correspond (e.g., 51(2)TE=51(2)TU), or the difference is below a threshold level, the time differential value is constant, and the network communications manager 40 need not accommodate the current inherent clock rate of the digital to analog converter clock 34 of the synchrony group member.

As an example of one way the network communications manager 40 adjusts the number of samples in one or more frames to accommodate the current inherent clock rate of the digital to analog converter clock 34 of a synchrony group member, consider a situation where the clock used by an audio information channel device 23 indicates a sampling rate of 44105 samples per second for the audio information channel device 23. A synchrony group member with a digital to analog converter clock 34 operating at a current inherent clock rate of 44100 samples per second will require the network communications manager 40 for the synchrony group member to reduce the number of samples in one or more frames by five samples for each one second interval that a particular track(s) comprising one or more frames are being played by the synchrony group member.

Continuing this example, a second synchrony group member with a digital to analog converter clock 34 operating at a current inherent clock rate of 44110 samples per second will require the network communications manager 40 for the second synchrony group member to increase the number of samples in one or more frames by five samples for each one second interval that a particular track(s) comprising one or more frames is being played by the second synchrony group member. As a result of the independent adjustments taking place within the first and second synchrony group members in relation to their shared audio information channel device 23, both synchrony group members will be playing the same or nearly the same frame at the same time, despite the differences in their respective current inherent clock rates.

An information channel device 23 may be configured to periodically receive the respective current inherent clock rates of one or more synchrony group members comprising a synchrony group. Using this information, the audio information channel device 23 performs the requisite adjustments (instead of the respective one or more synchrony group members) and sends one or more tracks to each synchrony group member, wherein the one or more tracks are adjusted to accommodate the current inherent clock rates of the respective synchrony group members. Accordingly, as a result of the multiple adjustments taking place within the audio information channel device 23 with respect to the current inherent clock rates of the one or more synchrony group members, all synchrony group members may play the same or nearly the same frame at the same time, despite the differences in their respective current inherent clock rates.

The exemplary zone player 11 serving as a synchrony group member may or may not include an audio amplifier 35 (FIG. 3). Further, as described herein, an audio information channel device 23 may perform the requisite sample adjustments or each synchrony group member may perform the requisite sample adjustments. Provided the synchrony group member and/or the audio reproduction device 15 (that is wired or wirelessly associated with the synchrony group member) includes at least one amplifier, regardless of scenario, the audio reproduction device 15 may adapt and maintain as constant a current inherent clock rate of the synchrony group member. Accordingly, the audio reproduction device 15 may play the same or nearly the same frame at the same time as another synchrony group member. This may be advantageous, because some audio reproduction devices 15 may be incapable of making timely clock rate adjustments. Consequently, by adjusting samples per frame, some exemplary systems and methods as described herein may function with audio reproduction devices 15 that would otherwise be incompatible with those systems and methods that include clock rate adjustments for achieving a synchronous performance.

While various systems and methods have been described above, it should be understood that they have been presented by way of example only, and not limitation. Thus, the breadth and scope of a preferred embodiment should not be limited by any of the above-described exemplary systems and methods.

The invention claimed is:

1. A system comprising:
    a distribution device configured to maintain a clock rate and distribute a series of tasks, each task having a plurality of samples per frame associated with a time stamp indicating a time when the respective task is to be executed; and
    an execution device configured to execute the series of tasks at the respective times indicated and to provide information to the distribution device, wherein the distribution device is configured to adjust, based on the information, the number of samples per frame that the distribution device uses for a subsequent task in relation to the clock rate maintained by the distribution device.

2. The system of claim 1, wherein the adjustment of the number of samples per frame is based on a clock rate of the execution device.

3. The system of claim 1, further comprising a plurality of execution devices wherein one of the execution devices is a master execution device configured to control the distribution of tasks by the distribution device.

4. The system of claim 3, further comprising a user interface module configured to control the master execution device.

5. The system of claim 4, wherein the master execution device is configured to enable another execution device to join the plurality of execution devices.

6. The system of claim 1, wherein the tasks are distributed to the execution device using a selected multi-cast transmission methodology.

7. The system of claim 3, wherein the master execution device is configured to transfer the ability to control the distribution device such that another execution device becomes the new master execution device.

8. The system of claim 3, wherein the master execution device is configured to allow migration of the distribution control function to another execution device in the system.

9. A method of operating a system comprising the steps of:
    distributing a series of tasks to a plurality of execution devices, each task having a plurality of samples per frame associated with a time stamp indicating when the respective task is to be executed;
    associating each of the tasks with a time stamp;
    indicating a time, relative to a common clock at which each execution device is to execute the respective tasks; and
    based on information received from each execution device, adjusting the number of samples per frame that are distributed with a subsequent task in relation to the common clock.

10. The method of claim 9, further comprising the step of enabling at least one of the execution devices to execute each task that it receives at a determined time.

11. The method of claim 9, further comprising the step of enabling an execution device to function as a master execution device.

12. The method of claim 9, further comprising the step of enabling an additional execution device to join the plurality of execution devices.

13. The method of claim 9, wherein the tasks are distributed to the execution devices using a selected multi-cast transmission methodology.

14. The method of claim 9, further comprising the step of migrating the function of the distribution of tasks from one execution device to another execution device.

15. The method of claim 9, further comprising the step of obtaining information associated with the tasks from a source of audio information.

16. The method of claim 9, further comprising the step of distributing tasks to a second group of execution devices.

17. A system comprising:
an execution device configured to maintain a clock rate and to execute a series of tasks; and
a distribution device configured to distribute the series of tasks to the execution device, each task having a plurality of samples per frame associated with a time stamp indicating when the respective task is to be executed, and configured to adjust the number of samples per frame that are distributed with a subsequent task in relation to the clock rate maintained by the execution device.

18. A system comprising:
a distribution device configured to maintain a clock rate and distribute a series of tasks, each task having a plurality of samples per frame associated with a time stamp indicating when the respective task is to be executed; and
an execution device configured to execute the series of tasks at the times indicated and to provide information to the distribution device, wherein the distribution device is configured to adjust, based on the information, the number of samples per frame the distribution device uses for a subsequent task in relation to the clock rate maintained by the distribution device and further configured to send the samples to an audio reproduction device.

19. A system comprising:
an execution device configured to maintain a clock rate, to execute a series of tasks, and to send the series of tasks to an audio reproduction device; and
a distribution device configured to distribute the series of tasks to the execution device, each task having a plurality of samples per frame associated with a time stamp indicating when the respective task is to be executed, and configured to adjust the number of samples per frame that are distributed with a subsequent task in relation to the clock rate maintained by the execution device.

\* \* \* \* \*